(12) United States Patent
Kim

(10) Patent No.: US 7,893,755 B2
(45) Date of Patent: Feb. 22, 2011

(54) INTERNAL VOLTAGE GENERATION CIRCUIT

(75) Inventor: Jae Hoon Kim, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/459,382

(22) Filed: Jun. 29, 2009

(65) Prior Publication Data

US 2010/0085113 A1    Apr. 8, 2010

(30) Foreign Application Priority Data

Oct. 2, 2008   (KR) ...................... 10-2008-0097389

(51) Int. Cl.
*G05F 1/46*    (2006.01)
(52) U.S. Cl. ........................ 327/541; 327/543; 323/341; 323/315; 363/74
(58) Field of Classification Search ................. None
See application file for complete search history.

(56) References Cited

U.S. PATENT DOCUMENTS 7,362,167 B2 *    4/2008    Park et al. ................... 327/543
7,468,928 B2 *    12/2008    Byeon ......................... 365/226
7,579,821 B2 *    8/2009    Lee et al. .................... 323/313
7,646,652 B2 *    1/2010    Byeon .................... 365/189.09
2009/0027105 A1    1/2009    Son
2009/0091376 A1    4/2009    Kim et al.
2009/0168582 A1*    7/2009    Chu ............................ 365/226
2010/0085829 A1*    4/2010    Son ............................. 365/226

FOREIGN PATENT DOCUMENTS

KR    10-2001-0004661 A    1/2001
KR    10-2003-0027197 A    4/2003

* cited by examiner

*Primary Examiner*—Lincoln Donovan
*Assistant Examiner*—Terry L Englund
(74) *Attorney, Agent, or Firm*—John P. White; Cooper & Dunham LLP

(57) ABSTRACT

An internal voltage generation circuit includes a signal generation unit which generates first and second level signals and first and second control signals from a reference voltage generated by voltage-dividing an internal power and generates first and second driving signals by comparing levels of the internal power and the reference voltage, a driving control unit which receives the first and second level signals and drives the internal voltage in response to an active signal, and a driving unit which receives the first and second driving signals and drives the internal voltage.

18 Claims, 3 Drawing Sheets

INTERNAL VOLTAGE GENERATION CIRCUIT

TECHNICAL FIELD

The present disclosure relates to a semiconductor memory device, and more particularly, to an internal voltage generation circuit with an improved response speed by increasing a drivability of an internal voltage (VCP/VBLP) upon active operation.

BACKGROUND

In general, a memory device generates and uses an internal voltage required for its internal operation using a power voltage (VDD) and a ground voltage (VSS) supplied from the outside. The voltage required for internal operation of the semiconductor memory device includes an internal power (VCORE) supplied to a memory core region, a high voltage (Vpp) used upon driving of a word line or overdriving and a back bias voltage (VBB) supplied as a bulk voltage of an NMOS transistor in the core region.

The internal voltage also includes a cell plate voltage (VCP) used as a plate voltage of a memory cell capacitor and a bit line precharge voltage (VBLP) used to precharge a bit line. In general, the cell plate voltage (VCP) and the bit line precharge voltage (VBLP) are generated from the internal power (VCORE) and generated to a half level of the internal power (VCORE) to minimize current consumption.

FIG. 1 is a circuit diagram illustrating a conventional internal voltage generation circuit.

The conventional internal voltage generation circuit, as illustrated in FIG. 1, for generating a cell plate voltage VCP or a bit line precharge voltage VBLP voltage-divides the internal power VCORE through resistance elements R10, R11 and drives the internal voltage VCP/VBLP by comparing a level of a voltage of a node nd10 generated to a half level of the internal power VCORE and a level of the internal voltage VCP/VBLP.

Operation of the internal voltage generation circuit shown in FIG. 1 will be described in more detail.

Since levels of pull-up driving signal PDRV and pull-down driving signal NDRV are also regularly maintained when the level of the internal voltage VCP/VBLP is not varied at the half level of the internal power VCORE, the internal voltage VCP/VBLP is driven by a regular current and is maintained at a regular level.

In this state, if the level of the internal voltage VCP/VBLP is lowered below the voltage of the node nd10, the levels of the pull-up driving signal PDRV and the pull-down driving signal NDRV are gradually decreased and a turn-on degree of a PMOS transistor P17 becomes larger than a turn-on degree of an NMOS transistor N19. Accordingly, the level of the internal voltage VCP/VBLP is increased. Also, if the level of the internal voltage VCP/VBLP is raised above the voltage of the node nd10, the levels of the pull-up driving signal PDRV and the pull-down driving signal NDRV are gradually increased and the turn-on degree of the NMOS transistor N19 becomes larger than the turn-on degree of the PMOS transistor P17. Accordingly, the level of the internal voltage VCP/VBLP is decreased. In other words, the internal voltage generation circuit controls the level of the internal voltage VCP/VBLP to be generated to a half level of the internal power VCORE.

In general, since the level of the internal voltage VCP/VBLP is maintained regularly when the semiconductor memory device is in a standby mode, the PMOS transistor P17 and the NMOS transistor N19 are turned off and are in a state of not driving the internal voltage VCP/VBLP. A period where a current for driving the internal voltage VCP/VBLP (hereinafter, referred to as 'driving current') does not flow at all through the PMOS transistor P17 and the NMOS transistor N19 as described above is referred to as a dead zone. Meanwhile, when the semiconductor memory device performs active operation, the level of the internal voltage VCP/VBLP varies significantly as consumption of the internal voltage VCP/VBLP is increased.

However, the PMOS transistor P17 and the NMOS transistor N19 have significantly large parasitic capacitances since the PMOS transistor P17 and the NMOS transistor N19 that drive the internal voltage VCP/VBLP are formed in a large size for the increase in the drivability. Such large value of the parasitic capacitance acts as a factor that lowers a response speed of the internal voltage generation circuit.

BRIEF SUMMARY

In an aspect of this disclosure, there is provided an internal voltage generation circuit with an improved response speed by increasing a drivability of an internal voltage (VCP/VBLP) upon active operation.

In an embodiment, an internal voltage generation circuit includes a signal generation unit which generates first and second level signals and first and second control signals from a reference voltage generated by voltage-dividing an internal power and generates first and second driving signals by comparing levels of an internal voltage and the reference voltage, a driving unit which receives the first and second driving signals and drives the internal voltage, and a driving control unit which receives the first and second level signals and controls the internal voltage in response to an active signal.

In another embodiment, an internal voltage generation unit includes a reference voltage generation unit which generates a reference voltage by voltage-dividing an internal power, a level signal generation unit which receives the reference voltage and generates a first level signal and a second level signal, a driving signal generation unit which receives the first and second level signals and generates first and second control signals and first and second driving signals, a driving control unit which receives the first level signal, the second level signal, the first control signal and the second control signal and drives an internal voltage in response to an active signal, and a driving unit which receives the first and second driving signals and drives the internal voltage.

BRIEF DESCRIPTION OF THE DRAWINGS

The above and other aspects, features and other advantages will be more clearly understood from the following detailed description taken in conjunction with the accompanying drawings, in which.

DESCRIPTION OF PREFERRED EMBODIMENTS

Hereinafter, exemplary embodiments of the present invention will be described with reference to accompanying drawings. However, the embodiments are for illustrative purposes only and are not intend to limit the scope of the invention.

Figure 1:
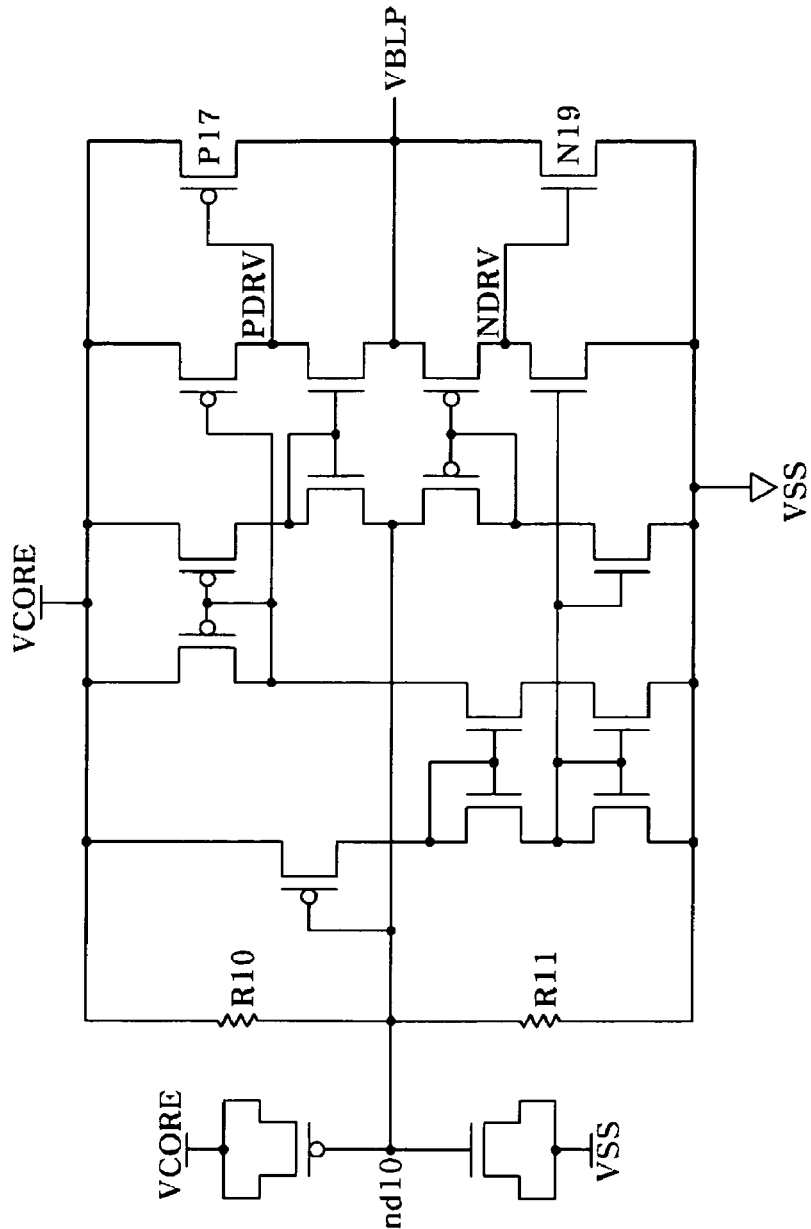
FIG. 1 is a circuit diagram illustrating a conventional internal voltage generation circuit.
Figure 2:
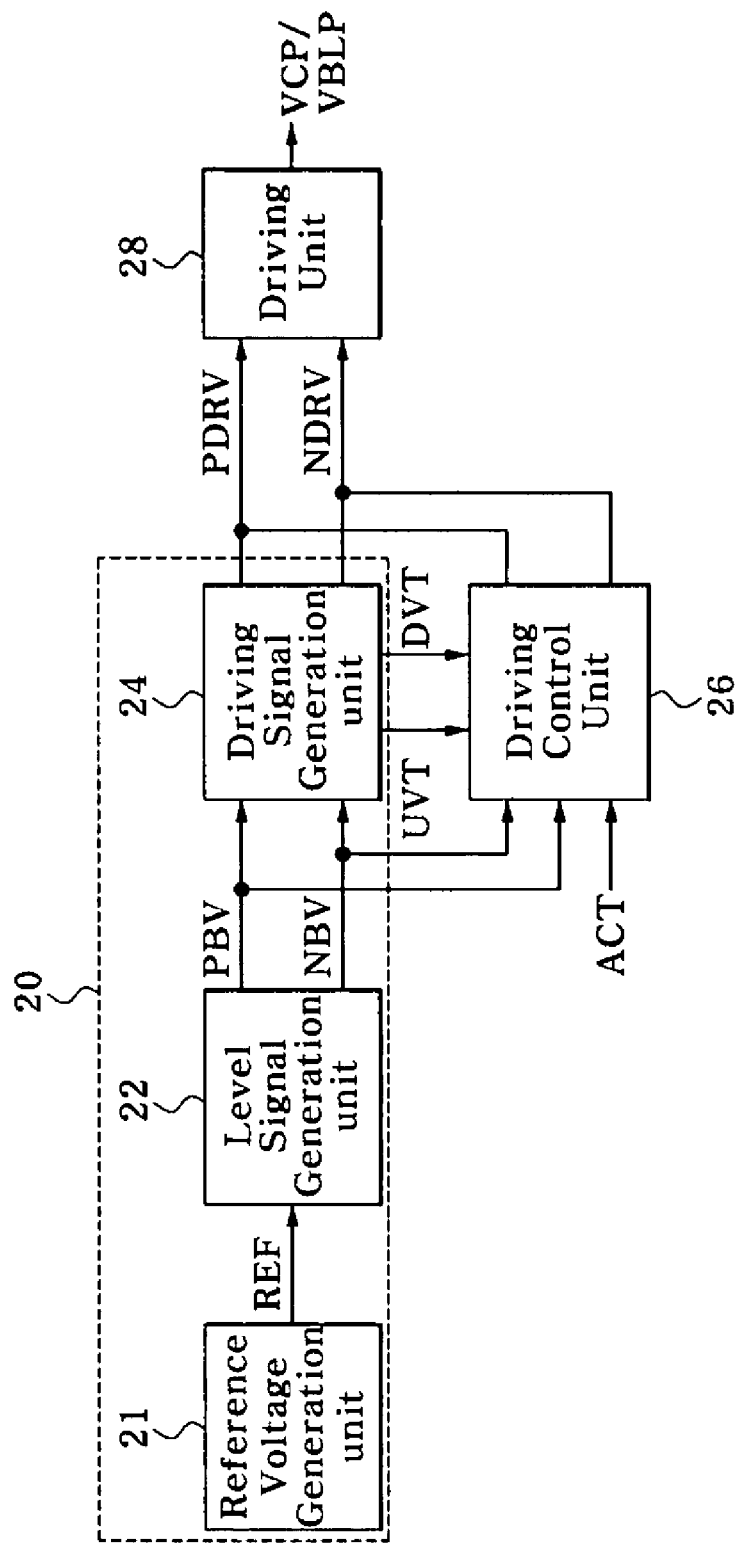
FIG. 2 is a block diagram illustrating a configuration of an internal voltage generation circuit in accordance with an embodiment of the present invention.
Figure 3:
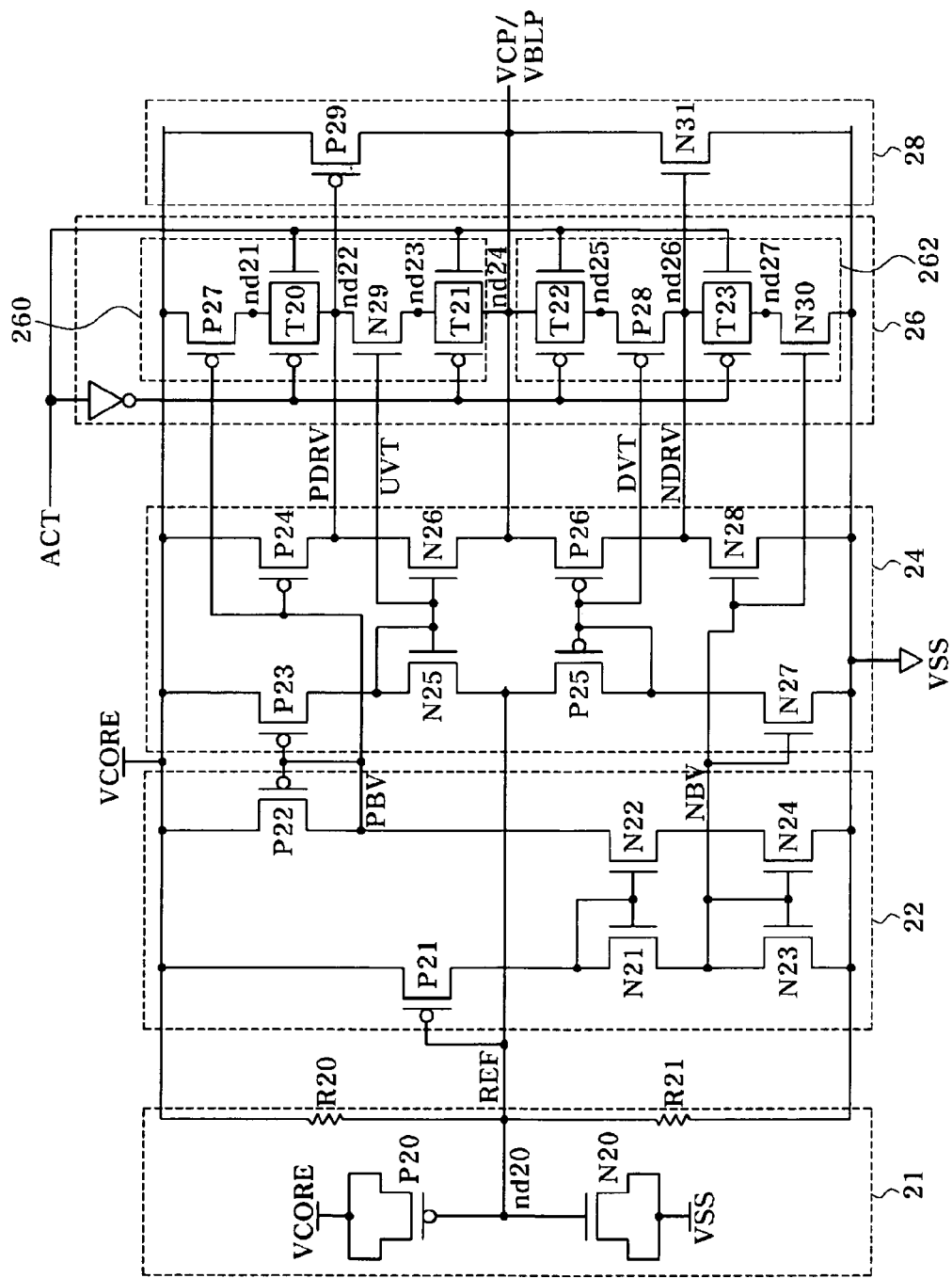
FIG. 3 is a circuit diagram illustrating the internal voltage generation circuit of FIG. 2.

FIG. 2 is a block diagram illustrating a configuration of an internal voltage generation circuit in accordance with an embodiment of the present invention, and FIG. 3 is a circuit diagram illustrating the internal voltage generation circuit of FIG. 2.

As illustrated in FIG. 2, the internal voltage generation circuit in accordance with an embodiment of the present invention includes a signal generation unit 20, a driving control unit 26 and a driving unit 28. The signal generation unit 20 includes a reference voltage generation unit 21, a level signal generation unit 22 and a driving signal generation unit 24.

Elements included in the internal voltage generation circuit will be described in more detail with reference to FIG. 3.

The reference voltage generation unit 21 includes resistance elements R20, R21 having the same resistance value, and a PMOS transistor P20 and an NMOS transistor N20 that operate as a capacitor for maintaining a charge of a node nd20, and voltage-divides an internal power VCORE and generates a reference voltage REF having a half level of the internal power VCORE.

The level signal generation unit 22 includes PMOS transistors P21, P22 and NMOS transistors N21-N24 that form a current mirror, and generates a first level signal PBV for regulating a current amount supplied from the internal power VCORE and a second level signal NBV for regulating a current amount discharged to the ground voltage VSS.

The driving signal generation unit 24 includes PMOS transistors P23, P24 turned on by the input of the first level signal PBV thereto, NMOS transistors N25, N26 that form a current mirror, PMOS transistors P25, P26 that form a current mirror, and NMOS transistors N27, N28 turned on by the input of the second level signal NBV thereto. The driving signal generation unit 24 sets, according to the reference voltage REF, levels of the first control signal UVT that is set as high as a threshold voltage of the NMOS transistor N25 and the second control signal DVT that is set as low as a threshold voltage of the PMOS transistor P25. Also, the driving signal generation unit 24 compares the reference voltage REF with the internal voltage VCP/VBLP and generates a first driving signal PDRV and a second driving signal NDRV of which levels are decreased when the level of the internal voltage VCP/VBLP is lower than the level of the reference voltage REF and are increased when the level of the internal voltage VCP/VBLP is higher than the level of the reference voltage REF.

The driving control unit 26 includes a pull-up unit 260 that receives the first level signal PBV and the first control signal UVT and pulls up the internal voltage VCP/VBLP and a pull-down unit 262 that receives the second level signal NBV and the second control signal DVT and pulls down the internal voltage VCP/VBLP.

The pull-up unit 260 includes a PMOS transistor P27 connected between the internal voltage VCORE and a node nd21 and turned on in response to the first level signal PBV, a first transfer gate T20 transferring a signal of the node nd21 to a node nd22 in response to an active signal ACT, an NMOS transistor N29 connected between the node nd22 and a node nd23 and turned on in response to the first control signal UVT, and a second transfer gate T21 transferring a signal of the node nd23 to a node nd24 in response to the active signal ACT.

The pull-down unit 262 includes a third transfer gate T22 transferring a signal of the node nd24 to a node nd25 in response to the active signal ACT, a PMOS transistor P28 connected between the node nd25 and a node nd26 and turned on in response to the second control signal DVT, a fourth transfer gate T23 transferring a signal of the node nd26 to a node nd27 in response to the active signal ACT, and an NMOS transistor N30 connected between the node nd27 and the ground voltage VSS and turned on in response to the second level signal NBV.

The driving unit 28 includes a PMOS transistor P29 connected between the internal power VCORE and the node nd24 and pulling up the internal voltage VCP/VBLP in response to the first driving signal PDRV, and an NMOS transistor N31 connected between the node nd24 and the ground voltage VSS and pulling down the internal voltage VCP/VBLP in response to the second driving signal NDRV.

Operation of the internal voltage generation circuit configured as described above will be described with respect to before and after performing active operation.

Hereinafter, a case in which active operation is not performed will be described.

When active operation is not performed, the active signal ACT is at a low level. Therefore, the first through fourth transfer gates T20-T23 are turned off and the driving control unit 26 does not operate. In a state that the driving control unit 26 does not operate, driving of the internal voltage VCP/VBLP is performed only by the driving unit 28.

More specifically, the reference voltage generation unit 21 voltage-divides the internal power VCORE and generates the reference voltage REF having a half level of the internal power VCORE. Next, the level signal generation unit 22 receives the reference voltage REF and generates a first level signal PBV for regulating a current amount supplied from the internal power VCORE and generates a second level signal NBV for regulating a current amount discharged to the ground voltage VSS.

Next, the driving signal generation unit 24 sets, according to the reference voltage REF, levels of the first control signal UVT (that is set as high as a threshold voltage of the NMOS transistor N25) and the second control signal DVT (that is set as low as a threshold voltage of the PMOS transistor P25). Also, the driving signal generation unit 24 compares the reference voltage REF with the internal voltage VCP/VBLP and generates a first driving signal PDRV and a second driving signal NDRV, levels of which are decreased when the level of the internal voltage VCP/VBLP is lower than the level of the reference voltage REF and are increased when the level of the internal voltage VCP/VBLP is higher than the level of the reference voltage REF.

Next, the driving unit 28 receives the first driving signal PDRV and the second driving signal NDRV and drives the internal voltage VCP/VBLP.

Hereinafter, a case in which active operation is performed will be described.

When active operation is performed, the active signal ACT is at a high level. Therefore, the first through fourth transfer gates T20-T23 are turned on and the driving control unit 26 operates. In a state that the driving control unit 26 operates, the driving of the internal voltage VCP/VBLP is performed by the driving control unit 26 and the driving unit 28.

More specifically, the reference voltage generation unit 21 voltage-divides the internal power VCORE and generates the reference voltage REF having a half level of the internal power VCORE. Next, the level signal generation unit 22 receives the reference voltage REF and generates a first level signal PBV for regulating a current amount supplied from the internal power VCORE and generates a second level signal NBV for regulating a current amount discharged to the ground voltage VSS.

Next, the driving signal generation unit 24 sets, according to the reference voltage REF, levels of the first control signal UVT, that is set as high as a threshold voltage of the NMOS transistor N25, and the second control signal DVT, that is set as low as a threshold voltage of the PMOS transistor P25. Also, the driving signal generation unit 24 compares the reference voltage REF with the internal voltage VCP/VBLP and generates a first driving signal PDRV and a second driving signal NDRV, levels of which are decreased when the level of the internal voltage VCP/VBLP is lower than the level of the reference voltage REF and are increased when the level of the internal voltage VCP/VBLP is higher than the level of the reference voltage REF.

Next, the driving control unit 26 receives the first level signal PBV, the second level signal NBV, the first control signal UVT and the second control signal DVT and drives the internal voltage VCP/VBLP. Also, the driving unit 28 receives the first driving signal PDRV and the second driving signal NDRV and drives the internal voltage VCP/VBLP.

As described above, the internal voltage generation circuit in accordance with an embodiment of the present invention drives the internal voltage VCP/VBLP only by the driving unit 28 in a case that active operation is not performed, and on the other hand, drives the internal voltage VCP/VBLP by the driving control unit 26 and the driving unit 28 in a case that active operation is performed. As is apparent from the above description, the internal voltage generation circuit in accordance with an embodiment of the present invention is provided with a driving control unit 26 to complement the driving unit 28 which has significantly large parasitic capacitance upon active operation in which consumption of the internal voltage VCP/VBLP is increased, thereby improving a response speed of the internal voltage generation circuit.

While the present invention has been described with respect to the specific examples and embodiments, it will be apparent to those skilled in the art that various changes and modifications may be made without departing from the spirit and scope of the invention as defined in the following claims.

The present disclosure claims priority to Korean application number 10-2008-0097389, filed on Oct. 2, 2008, the entire contents of which are incorporated herein by reference.

What is claimed is:

1. An internal voltage generation circuit, comprising:
 a signal generation unit which generates first and second level signals and first and second control signals from a reference voltage generated by voltage-dividing an internal power and generates first and second driving signals by comparing levels of an internal voltage and the reference voltage;
 a driving unit which receives the first and second driving signals and drives the internal voltage; and
 a driving control unit which receives the first and second level signals and controls the internal voltage in response to an active signal.

2. The internal voltage generation circuit of claim 1, wherein the first level signal is for regulating a first current amount supplied from the internal power and the second level signal is for regulating a second current amount discharged to a ground voltage.

3. The internal voltage generation circuit of claim 1, wherein the first control signal is formed to a higher level than the reference voltage and is a first reference signal for pull-up of the internal voltage, and the second control signal is formed to a lower level than the reference voltage and is a second reference signal for pull-down of the internal voltage.

4. The internal voltage generation circuit of claim 1, wherein levels of the first and second driving signals are decreased when the level of the internal voltage is lower than the level of the reference voltage and are increased when the level of the internal voltage is higher than the level of the reference voltage.

5. The internal voltage generation circuit of claim 1, wherein the driving control unit includes:
 a pull-up unit which receives the first level signal and the first control signal and pulls up the internal voltage; and
 a pull-down unit which receives the second level signal and the second control signal and pulls down the internal voltage.

6. The internal voltage generation circuit of claim 5, wherein the pull-up unit includes:
 a first switch device which is connected between the internal power and a first node and is turned on in response to the first level signal;
 a first transfer gate which transfers a signal of the first node to a second node in response to the active signal;
 a second switch device which is connected between the second node and a third node and is turned on in response to the first control signal; and
 a second transfer gate which transfers a signal of the third node to a fourth node in response to the active signal,
 wherein the internal voltage, outputted to the fourth node, is pulled up when the first switch device, the first transfer gate, the second switch device and the second transfer gate are turned on.

7. The internal voltage generation circuit of claim 6, wherein the first switch device is a PMOS transistor and the second switch device is an NMOS transistor.

8. The internal voltage generation circuit of claim 5, wherein the pull-down unit includes:
 a first transfer gate which transfers a signal of a first node to a second node in response to the active signal;
 a first switch device which is connected between the second node and a third node and is turned on in response to the second control signal;
 a second transfer gate which transfers a signal of the third node to a fourth node in response to the active signal; and
 a second switch device which is connected between the fourth node and a ground voltage and is turned on in response to the second level signal,
 wherein the internal voltage, outputted at the first node, is pulled down when the first transfer gate, the first switch device, the second transfer gate and the second switch device are turned on.

9. The internal voltage generation circuit of claim 8, wherein the first switch device is a PMOS transistor and the second switch device is an NMOS transistor.

10. An internal voltage generation unit, comprising:
 a reference voltage generation unit which generates a reference voltage by voltage-dividing an internal power;
 a level signal generation unit which receives the reference voltage and generates a first level signal and a second level signal;
 a driving signal generation unit which receives the first and second level signals and generates first and second control signals and first and second driving signals;
 a driving control unit which receives the first level signal, the second level signal, the first control signal and the second control signal and controls an internal voltage in response to an active signal; and
 a driving unit which receives the first and second driving signals and drives the internal voltage.

11. The internal voltage generation circuit of claim 10, wherein the first level signal is for regulating a first current amount supplied from the internal power and the second level signal is for regulating a second current amount discharged to a ground voltage.

12. The internal voltage generation circuit of claim 10, wherein the first control signal is formed to a higher level than the reference voltage and is a first reference signal for pull-up of the internal voltage, and the second control signal is formed to a lower level than the reference voltage and is a second reference signal for pull-down of the internal voltage.

13. The internal voltage generation circuit of claim 10, wherein levels of the first and second driving signals are decreased when the level of the internal voltage is lower than the level of the reference voltage and are increased when the level of the internal voltage is higher than the level of the reference voltage.

14. The internal voltage generation circuit of claim 10, wherein the driving control unit includes:
   a pull-up unit which receives the first level signal and the first control signal and pulls up the internal voltage; and
   a pull-down unit which receives the second level signal and the second control signal and pulls down the internal voltage.

15. The internal voltage generation circuit of claim 14, wherein the pull-up unit includes:
   a first switch device which is connected between the internal power and a first node and is turned on in response to the first level signal;
   a first transfer gate which transfers a signal of the first node to a second node in response to the active signal;
   a second switch device which is connected between the second node and a third node and is turned on in response to the first control signal; and
   a second transfer gate which transfers a signal of the third node to a fourth node in response to the active signal,
   wherein the internal voltage, outputted to the fourth node, is pulled up when the first switch device, the first transfer gate, the second switch device and the second transfer gate are turned on.

16. The internal voltage generation circuit of claim 15, wherein the first switch device is a PMOS transistor and the second switch device is an NMOS transistor.

17. The internal voltage generation circuit of claim 14, wherein the pull-down unit includes:
   a first transfer gate which transfers a signal of a first node to a second node in response to the active signal;
   a first switch device which is connected between the second node and a third node and is turned on in response to the second control signal;
   a second transfer gate which transfers a signal of the third node to a fourth node in response to the active signal; and
   a second switch device which is connected between the fourth node and a ground voltage and is turned on in response to the second level signal,
   wherein the internal voltage, outputted at the first node, is pulled down when the first transfer gate, the first switch device, the second transfer gate and the second switch device are turned on.

18. The internal voltage generation circuit of claim 17, wherein the first switch device is a PMOS transistor and the second switch device is an NMOS transistor.

* * * * *